United States Patent
Nagaoka et al.

(10) Patent No.: US 8,691,890 B2
(45) Date of Patent: Apr. 8, 2014

(54) UNSATURATED POLYESTER RESIN COMPOSITION FOR USE IN LED REFLECTOR, AND LED REFLECTOR AND LED LUMINAIRE USING SAID COMPOSITION

(75) Inventors: Sunao Nagaoka, Mie (JP); Toshio Kubo, Mie (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/880,905

(22) PCT Filed: Jun. 14, 2011

(86) PCT No.: PCT/JP2011/063594
§ 371 (c)(1),
(2), (4) Date: Apr. 22, 2013

(87) PCT Pub. No.: WO2012/053249
PCT Pub. Date: Apr. 26, 2012

(65) Prior Publication Data
US 2013/0261243 A1    Oct. 3, 2013

(30) Foreign Application Priority Data

Oct. 22, 2010  (JP) ................................. 2010-238026
Apr. 12, 2011  (JP) ................................. 2011-087910

(51) Int. Cl.
C08L 67/06    (2006.01)

(52) U.S. Cl.
USPC ........... 523/521; 523/513; 523/514; 523/516; 523/527; 524/423; 524/425; 524/430; 524/432; 524/433; 524/437; 524/492; 524/493; 524/494; 524/497

(58) Field of Classification Search
USPC .......... 523/513, 514, 516, 527, 521; 524/423, 524/425, 430, 432, 433, 437, 492–494, 497
See application file for complete search history.

(56) References Cited

U.S. PATENT DOCUMENTS

| 4,134,884 A  * | 1/1979 | Takiyama et al. ................ 525/28 |
| 6,332,998 B1 * | 12/2001 | Yamagata et al. ............ 264/496 |
| 2008/0097030 A1 | 4/2008 | Kaneoka et al. |

FOREIGN PATENT DOCUMENTS

| CN | 101137720 A | 3/2008 |
| CN | 101654548 A | 2/2010 |
| EP | 1857505 A1 | 11/2007 |
| JP | 01-182316 | 7/1989 |
| JP | 2008-255338 A | 10/2008 |
| JP | 2010-049918 A | 3/2010 |
| JP | 2010-235756 A | 10/2010 |
| KR | 2010-0023742 A | 3/2010 |
| WO | WO-2006/095414 A1 | 9/2006 |

OTHER PUBLICATIONS

International Search Report mailed Jul. 12, 2011 issued in corresponding International Application No. PCT/JP2011/063594.

* cited by examiner

*Primary Examiner* — Peter Szekely
(74) *Attorney, Agent, or Firm* — McDermott Will & Emery LLP

(57) ABSTRACT

Provided are a resin composition for general-purpose LED reflectors, which discolors little through thermal deterioration and is excellent in heat discoloration resistance, which can provide an LED lamp using it and having a long life, which is relatively inexpensive and has good storage stability, and which is excellent in handleability and workability, and an LED reflector and an LED luminaire using the resin composition.

The resin composition is a dry-type unsaturated polyester resin composition containing at least an unsaturated polyester resin, a polymerization initiator, an inorganic filler, a white pigment, a release agent and a reinforcing material, wherein the unsaturated polyester resin is within a range of from 14 to 40% by mass relative to the entire amount of the composition, the total amount of the inorganic filler and the white pigment is within a range of from 44 to 74% by mass relative to the entire amount of the composition, and the proportion of the white pigment to the total amount of inorganic filler and the white pigment is at least 30% by mass.

11 Claims, 1 Drawing Sheet

UNSATURATED POLYESTER RESIN COMPOSITION FOR USE IN LED REFLECTOR, AND LED REFLECTOR AND LED LUMINAIRE USING SAID COMPOSITION

RELATED APPLICATIONS

This application is the U.S. National Phase under 35 U.S.C. §371 of International Application No. PCT/JP2011/063594, filed on Jun. 14, 2011, which in turn claims the benefit of Japanese Application No. 2010-238026, filed on Oct. 22, 2010, and Japanese Application No. 2011-087910, filed on Apr. 12, 2011, the disclosures of which Applications are incorporated by reference herein.

TECHNICAL FIELD

The present invention relates to an unsaturated polyester resin composition for LED reflectors excellent in heat discoloration resistance, and to an LED reflector and an LED luminaire using the resin composition.

BACKGROUND ART

Recently, with LED of which the use is expanding greatly, the problem is how to sustain long the initial brightness of LED.

The cause of brightness reduction in LED is the reduction in the reflectivity of the constitutive LED reflector owing to heat discoloration thereof, and use of a material that may discolor little by heat is a factor of life prolongation of LED.

Heretofore, there is known a ceramic LED reflector that has good heat discoloration resistance (for example, see Patent Reference 1). However, ceramics are limited in point of the workability thereof and are expensive, and therefore has a problem in that they are unsuitable for general-purpose LED reflectors.

Given the situation, for a general-purpose reflector for LED as a light source to replace a fluorescent lamp, an incandescent lamp and others, used are nylon and polyamide resin that have heretofore been known also for lighting systems (for example, see Patent References 2 to 4). These have relatively good heat resistance and are inexpensive.

CITATION LIST

Patent References

Patent Reference 1: WO2006/013899
Patent Reference 2: JP-A 6-200153
Patent Reference 3: JP-A 2002-374007
Patent Reference 4: JP-A 2010-100682

SUMMARY OF THE INVENTION

Problems that the Invention is to Solve

However, LED reflectors formed of heat-resistant nylon or polyamide resin discolor greatly by heat and have a drawback in that the life of the LED lamp using the reflector is short.

Accordingly, it is promoted to use a thermosetting epoxy resin molding material that discolors little through heat deterioration; however, the epoxy resin molding material is well adhesive to lead frames, but on the other hand, the burrs thereof to form during molding are also well adhesive to those frames, and it is not easy to remove the burrs. In addition, the epoxy resin molding material must be stored at low temperatures.

Moreover, the epoxy resin molding material has other drawbacks in that it is relatively expensive and its injection molding is not easy. Accordingly, the epoxy resin molding material is not suitable to general-purpose LED reflectors.

The invention has been made in consideration of the above-mentioned situation, and its object is to provide an unsaturated polyester resin composition for general-purpose LED reflectors, which discolors little through thermal deterioration and is excellent in heat discoloration resistance, which can provide an LED lamp using it and having a long life, which is relatively inexpensive and has good storage stability, and which is excellent in handleability and workability, and to provide an LED reflector and an LED luminaire using the resin composition.

Means for Solving the Problems

For solving the above-mentioned problems, the invention provides the following characteristic features.

Specifically, the unsaturated polyester resin composition for LED reflectors of the invention is a dry-type unsaturated polyester resin composition containing at least an unsaturated polyester resin, a polymerization initiator, an inorganic filler, a white pigment, a release agent and a reinforcing material, wherein the unsaturated polyester resin is within a range of from 14 to 40% by mass relative to the entire amount of the composition, the total amount of the inorganic filler and the white pigment is within a range of from 44 to 74% by mass relative to the entire amount of the composition, and the proportion of the white pigment to the total amount of inorganic filler and the white pigment is at least 30% by mass.

In the unsaturated polyester resin composition for LED reflectors, the unsaturated polyester is an unsaturated alkyd resin mixed with a crosslinking agent.

In the unsaturated polyester resin composition for LED reflectors, the inorganic filler is preferably at least one selected from a group consisting of silica, aluminium hydroxide, aluminium oxide, magnesium oxide, barium sulfate, magnesium carbonate and barium carbonate.

In the unsaturated polyester resin composition for LED reflectors, the white pigment is preferably at least one selected from a group consisting of titanium oxide, barium titanate, strontium titanate, aluminium oxide, magnesium oxide, zinc oxide, barium sulfate, magnesium carbonate and barium carbonate.

In the unsaturated polyester resin composition for LED reflectors, the amount of the white pigment is preferably within a range of from 100 to 300 parts by mass relative to 100 parts by mass of the unsaturated polyester resin.

In the unsaturated polyester resin composition for LED reflectors, the mean particle size of the white pigment is preferably at most 2.0 μm.

In the unsaturated polyester resin composition for LED reflectors, preferably, the total amount of the inorganic filler and the white pigment is at most 500 parts by mass relative to 100 parts by mass of the unsaturated polyester resin, and the mean particle size of the inorganic filler is at most 250 μm.

In the unsaturated polyester resin composition for LED reflectors, preferably, the reinforcing material is glass fibers, and the amount of the reinforcing material is from 10 to 100 parts by mass relative to 100 parts by mass of the unsaturated polyester resin.

The LED reflector of the invention is formed by molding the unsaturated polyester resin composition for LED reflectors.

Preferably, the LED reflector is formed according to an injection molding method.

After molded, preferably, the LED reflector is deburred by blasting treatment after molding.

The LED luminaire of the invention is fitted with the LED reflector.

Advantage of the Invention

When molded into an LED reflector, the unsaturated polyester resin composition for LED reflectors of the invention discolors little through thermal deterioration and is excellent in heat discoloration resistance, and the LED lamp with the reflector has a long life, and in addition, the resin composition is inexpensive and has good storage stability and good handleability, and is excellent in workability in that it can be transfer-molded and can be also injection-molded.

MODE FOR CARRYING OUT THE INVENTION

Figure 1:
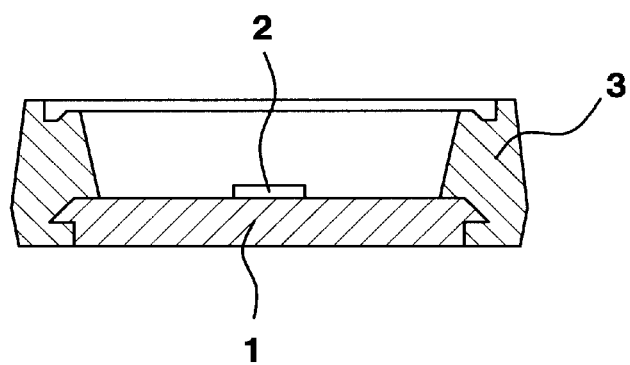
FIG. 1 This is a schematic cross-sectional view of an LED bulb.

Embodiments of the invention are described hereinunder.

The unsaturated polyester resin composition for LED reflectors of the invention uses, as the unsaturated polyester resin therein, an unsaturated alkyd resin that starts to soften at 50° C. or higher.

The unsaturated polyester resin composition for LED reflectors of the invention is a dry-type unsaturated polyester resin composition. Dry-type as referred to herein means the composition is solid in a temperature range of not higher than 30° C. and can be formed into granules through grinding or extrusion pelletizing.

The unsaturated polyester resin is obtained by mixing an unsaturated alkyd resin with a crosslinking agent such as a copolymerizing monomer or the like. The copolymerizing monomer is mixed along with other mixtures during production of the resin composition, but may be mixed with resin before production of the resin composition.

The unsaturated alkyd resin is one obtained through dehydrating condensation of an unsaturated polybasic acid or a saturated polybasic acid and a glycol.

The unsaturated polybasic acid includes maleic anhydride, fumaric acid, itaconic acid, citraconic acid, etc.

The saturated polybasic acid include phthalic anhydride, isophthalic acid, terephthalic acid, adipic acid, sebacic acid, tetrahydrophthalic anhydride, methyltetrahydrophthalic anhydride, endomethylenetetrahydrophthalic anhydride, HET acid, tetrabromophthalic anhydride, etc.

The glycol includes ethylene glycol, propylene glycol, diethylene glycol, dipropylene glycol, neopentyl glycol, 1,3-butanediol, 1,6-hexanediol, hydrogenated bisphenol A, bisphenol A propyleneoxide compound, dibromoneopentyl glycol, etc.

In the invention, among the unsaturated alkyd resin, preferred is use of an unsaturated alkyd resin having a melt viscosity of from 1000 to 2500 cP. Especially preferred is use of an isophthalic acid-based unsaturated alkyd resin, and a terephthalic acid-based unsaturated alkyd resin.

Using the unsaturated alkyl resin of the type makes it possible to provide an unsaturated polyester resin composition for LED reflectors excellent in moldability and heat discoloration resistance.

As the crosslinking agent to be mixed with the unsaturated alkyd resin, for example, there may be used a vinylic copolymerizing monomer such as styrene, vinyltoluene, divinylbenzene, α-methylstyrene, methyl methacrylate, vinyl acetate, etc.

Also usable here is a copolymerizing monomer such as diallyl phthalate, triallyl cyanurate, diallyl tetrabromophthalate, phenoxyethyl acrylate, 2-hydroxyethyl acrylate, 1,6-hexanediol diacrylate, etc. Further, their prepolymers are also usable here.

In the invention, especially preferred is use of diallyl phthalate prepolymer, diallyl phthalate monomer or styrene monomer. One type alone or two or more different types of these crosslinking agents may be used here either singly or as combined.

The ratio of the unsaturated alkyd resin to the crosslinking agent in the unsaturated polyester resin falls within a range of from 99/1 to 50/50 in terms of the ratio by mass thereof. In case where a monomer is used as the crosslinking agent and when the amount of the monomer is large, then the composition could not be a dry-type unsaturated polyester resin composition that is solid at room temperature; and therefore, it is desirable that the amount of the monomer is at most 10 parts by mass in 100 parts by mass of the unsaturated polyester resin.

The amount of the unsaturated polyester resin is within a range of from 14 to 40% by mass relative to the entire amount of the unsaturated polyester resin composition.

The unsaturated polyester resin composition for LED reflectors of the invention may use, as the polymerization initiator therein, a thermally-decomposing organic peroxide that is generally used in unsaturated polyester resin compositions.

The organic peroxide of the type includes t-butylperoxy 2-ethylhexylmonocarbonate, 1,1-di(t-hexylperoxy)cyclohexane, 1,1-di(t-butylperoxy)-3,3,5-trimethylcyclohexane, t-butylperoxy octanoate, benzoyl peroxide, methyl ethyl ketone peroxide, acetylacetone peroxide, t-butylperoxy benzoate, dicumyl peroxide, etc. One alone or two or more of these may be used here either singly or as combined.

Of those, preferred is use of an organic peroxide of which the 10-hour half-value temperature is not lower than 100° C. Concretely, preferred is use of dicumyl peroxide.

In the invention, as the white pigment, at least one selected from a group consisting of titanium oxide, barium titanate, strontium titanate, aluminium oxide, magnesium oxide, zinc oxide, barium sulfate, magnesium carbonate and barium carbonate is incorporated in the resin composition.

In the invention, of those white pigments, especially preferred are titanium oxide, aluminium oxide and barium titanate.

Titanium oxide includes, for example, anatase-type titanium oxide, rutile-type titanium oxide, Brucite-type titanium oxide. Of those, preferred is use of rutile-type titanium oxide excellent in heat stability.

Not specifically defined, aluminium oxide and barium oxide may be any known ones for use herein.

Preferably, the mean particle size of the white pigment is at most 2.0 μm, more preferably within a range of from 0.1 to 1.0 μm, even more preferably from 0.3 to 0.7 μm. The mean particle size may be measured through laser diffractiometry or the like.

In the invention, the amount of the white pigment is preferably at least 100 parts by mass relative to 100 parts by mass of the unsaturated polyester resin, but more preferably within a range of from 100 to 300 parts by mass.

When the amount of the white pigment therein falls within the range as above, then the resin composition can form an LED reflector excellent in heat discoloration resistance, white and having a high reflectivity.

In the invention, as the inorganic filler, at least one selected from a group consisting of silica, aluminium hydroxide, aluminium oxide, magnesium oxide, barium sulfate, magnesium carbonate and barium carbonate is incorporated in the resin composition.

In the invention, of those inorganic fillers, especially preferred is use of silica. Silica includes, for example, fused silica powder, spherical silica powder, ground silica powder, crystalline silica powder.

Preferably, the mean particle size of the inorganic filler is at most 250 µm, but more preferably within a range of from 10 to 100 µm. When the mean particle size falls within the range, then the resin composition can be an unsaturated polyester resin composition for LED reflectors having good moldability and excellent in heat discoloration resistance and moisture resistance. The mean particle size can be measured through laser diffractiometry or the like.

In the invention, the amount of the inorganic filler is preferably at least 50 parts by mass relative to 100 parts by mass of the unsaturated polyester resin, more preferably within a range of from 50 to 250 parts by mass.

When the amount of the inorganic filler falls within the range as above, then there may be provided an unsaturated polyester resin composition for LED reflectors having excellent moldability, and the composition can be molded into LED reflectors excellent in heat discoloration resistance and having a high reflectivity.

The total amount of the white pigment and the inorganic filler is within a range of from 44 to 74% by mass relative to the entire amount of the unsaturated polyester resin composition, preferably within a range of from 50 to 72% by mass.

The proportion of the white pigment to the total amount of the white pigment and the inorganic filler is at least 30% by mass, preferably within a range of from 40 to 85% by mass.

Further, the total amount of the white pigment and the inorganic filler is preferably at most 500 parts by mass relative to 100 parts by mass of the unsaturated polyester resin, more preferably within a range of from 100 to 400 parts by mass. When the total amount of the white pigment and the inorganic filler falls within the range, then the resin can secure suitable flowability and can have good moldability.

When in the form of finer particles, the white pigment and the inorganic filler tend to aggregate more and tend to absorb more oil, and if so, the resin composition would be hardly introduced into a mold, and therefore, the white pigment and the inorganic filler may be surface-treated with a fatty acid, a coupling agent or the like.

Any other inorganic filler may be suitably incorporated into the unsaturated polyester resin composition for LED reflectors of the invention, within a range not detracting from the flowability of the resin composition and not detracting from the reflectivity of the LED reflector formed of the resin composition.

As the additional ingredient, there may be mentioned oxides and their hydrates, inorganic foamed particles, hollow particles such as silica balloons, etc.

Not specifically defined, the reinforcing material for use in the invention may be any one generally used as a reinforcing material for unsaturated polyester resin compositions for FRP such as BMC, SMC, etc.

The reinforcing material includes, for example, glass fibers, vinylon fibers, aramid fibers, polyester fibers, wollastonite, potassium titanate whiskers, etc. Of those, preferred are glass fibers.

As the glass fibers, there are mentioned glass fibers of E glass (alkali-free glass for electric use) starting from silicate glass or borosilicate glass, C glass (alkali glass for chemical use), A glass (acid-resistant glass), S glass (high-strength glass), etc.; and these may be worked into long fibers (rovings), or short fibers (chopped strands) for use herein.

These glass fibers may be surface-treated for use herein.

In the invention, E glass fibers having a fiber diameter of from 10 to 15 µm may be bundled with a bundling agent such as vinyl acetate or the like, then surface-treated with a silane coupling agent, and thereafter cut into chopped strands having a length of from 3 to 6 mm; and the chopped strands of the type are especially preferred for use herein.

The amount of the reinforcing material is preferably from 10 to 200 parts by mass relative to 100 parts by mass of the unsaturated polyester resin, more preferably within a range of from 10 to 100 parts by mass, even more preferably from 20 to 80 parts by mass.

Using the reinforcing material under the condition as above, there can be provided an unsaturated polyester resin composition for LED reflectors excellent in strength characteristics, capable of suppressing curing shrinkage and having excellent reflectivity.

The release agent for use in the invention includes fatty acid-type, fatty acid metal salt-type, mineral-type waxes and others generally used for thermosetting resins, and especially preferred for use herein are fatty acid-type and fatty acid metal salt-type waxes which are excellent in heat discoloration resistance.

Concretely, there are mentioned stearic acid, zinc stearate, aluminium stearate and calcium stearate, and one alone or two or more of these release agents may be used here either singly or as combined.

The release agent may be incorporated in the resin composition in an amount falling within a range of from 4 to 15 parts by mass relative to 100 parts by mass of the unsaturated polyester resin. When the amount of the release agent falls within the range, then the resin composition can satisfy both good releasability and good appearance of molded products, and the LED reflectors to be formed of the resin composition of the type can have the most suitable reflectivity.

In the invention, in addition to these constitutive ingredient, a curing catalyst and a polymerization inhibitor for controlling the curing condition of the unsaturated polyester resin, and also a colorant, a tackifier and other organic additives and inorganic additives may be suitably incorporated in the resin composition.

The unsaturated polyester resin composition for LED reflectors of the invention may be produced by combining the ingredients, fully and uniformly mixing them using a mixer, a blender or the like, then kneading the resulting mixture using a pressure kneader, a hot roll, an extruder or the like, and thereafter grinding and granulating the mixture.

Preferably, the polymerization initiator is used as a master batch for enhancing the safety against fire and explosion.

The unsaturated polyester resin composition for LED reflectors of the invention as designed to have the formulation as above is a dry-type unsaturated polyester resin composition, and therefore different from any other viscous, wet-type unsaturated polyester resin composition than the dry-type unsaturated polyester resin composition of the invention, and different from an epoxy resin composition and others, the dry-type unsaturated polyester resin composition of the composition is excellent in storage stability and handleability.

The resin composition can be molded into LED reflectors according to various types of conventional thermosetting resin composition molding methods, and there can be produced long-life and inexpensive LED reflectors for LED luminaries such as LED bulbs and the like that discolor little through thermal degradation.

The unsaturated polyester resin composition for LED reflectors of the invention is a dry-type one and has good heat stability in melt, to which, therefore various hot melt molding methods such as an injection molding method, an injection compression molding method, a transfer molding method and the like are favorably applicable.

Of those, especially preferred is an injection molding method using an injection molding machine. According to an injection molding method, the molding time can be shortened more and LED reflectors having a complicated shape can be produced.

The other viscous wet-type unsaturated polyester resin compositions than the dry-type resin composition of the invention cannot be formed into ordinary pellets, and therefore the handleability thereof is poor. In case where the wet-type resin composition is molded with an injection molding machine, the hopper requires a plunder or the like unit, and therefore the production cost increases.

As opposed to this, the unsaturated polyester resin composition for LED reflectors of the invention is in the form of dry-type pellets and is therefore excellent in storage stability. Consequently, the resin composition can be molded by merely putting it into a hopper of an injection molding machine, and is therefore excellent in handleability. In addition, the production cost can be decreased.

The thermosetting resin would form burrs around the frame of the molded LED reflector, however, since the adhesiveness thereof is low, the burrs can be readily removed.

The formed burrs can be removed, for example, according to a known method. Above all, especially preferred is blasting treatment that is widely carried out for deburring unsaturated polyester resin composition.

The blasting treatment may be any ordinary blasting treatment for deburring, and includes, for example, shot blasting, sand blasting, glass bead blasting, etc.

The LED luminaire of the invention is fitted with the LED reflector produced in the manner as above. FIG. 1 shows a schematic cross-sectional view of an LED bulb as an example of the LED luminaire of the invention. The LED reflector 3 is a reflection plate to efficiently reflect the light from the LED device 2 mounted on the lead frame 1, and its shape may be suitably designed in consideration of the light quantity, the color and the directional characteristics of the LED device 2.

Preferably, the LED reflector 3 is so designed as to fold the lead frame 1 therein, as shown in FIG. 1, in consideration of the adhesiveness thereof to the lead frame 1.

Further, in case where a metal lead frame 1 is used, the surface of the metal may be treated with a triazine compound or the like for enhancing the adhesiveness thereof to the LED reflector 3.

EXAMPLES

The invention is described in more detail with reference to the following Examples, to which, however, the invention is not limited at all.

<Production of Unsaturated Polyester Resin Composition for LED Reflectors>

An unsaturated polyester resin composition for LED reflectors of Examples 1 to 9 shown in Table 1 and Comparative Examples 1 to 6 shown in Table 2 was prepared by combining the constitutive ingredients in the ratio shown in the Tables, and uniformly mixed in a Sigma blender, and then kneaded with a hot roll heated at 100° C. to give a sheet-like kneaded matter. This was cooled, ground and granulated to give a granular resin composition.

The constitutive ingredients used here are as follows:
(1) Resin
Unsaturated alkyd resin: terephthalic acid-based unsaturated alkyd resin, Japan U-Pica's U-Pica 8552
Epoxy resin: triglycidyl isocyanurate (epoxy equivalent 100), Nissan Chemical Industry's TEPCIC-S
Nylon resin: Nylon 46 resin (STANYL)
(2) Crosslinking Agent
Crosslinking agent 1: diallyl phthalate prepolymer, Daiso's DAP Polymer
Crosslinking agent 2: diallyl phthalate monomer, Daiso's DAP Monomer
Crosslinking agent 3: styrene monomer
(3) Polymerization Initiator
Dicumyl peroxide (40% master batch), NOF's Percumyl D40
(4) Epoxy Resin Curing Agent
Hexahydrophthalic anhydride, Shin-Nippon Rika's Rikacid HH
(5) White Pigment
White pigment 1: titanium oxide (rutile-type titanium oxide, mean particle size 0.4 μm), Tioxide Japan's Tioxide R-TC30
White pigment 2: aluminium oxide (mean particle size 0.5 μm)
White pigment 3: barium titanate (mean particle size 0.4 μm)
(6) Inorganic Filler
Inorganic filler 1: silica (fused silica, mean particle size 25 μm), Denki Kagaku Kogyo's FB820
Inorganic Filler 2: aluminium hydroxide (mean particle size 29 μm)
(7) Release Agent
Release agent: zinc stearate, Sakai Chemical Industry's SZ-P
(8) Reinforcing Material
Reinforcing material: glass fibers (3 mm long), Owens Corning Japan's CS03IE830A

TABLE 1

| | | | unit | Example 1 | Example 2 | Example 3 | Example 4 | Example 5 | Example 6 | Example 7 | Example 8 | Example 9 |
|---|---|---|---|---|---|---|---|---|---|---|---|---|
| Unsaturated Polyester Resin | Resin | Unsaturated Alkyd Resin | part by mass | 70 | 70 | 70 | 70 | 70 | 70 | 70 | 70 | 70 |
| | Crosslinking Agent 1 | Diallyl Phthalate Prepolymer | part by mass | 30 | 30 | 30 | 30 | 25 | 25 | 30 | 30 | 30 |

TABLE 1-continued

|  |  |  | unit | Example 1 | Example 2 | Example 3 | Example 4 | Example 5 | Example 6 | Example 7 | Example 8 | Example 9 |
|---|---|---|---|---|---|---|---|---|---|---|---|---|
|  | Crosslinking Agent 2 | Diallyl Phthalate Monomer | part by mass | — | — | — | — | 5 | 5 | — | — | — |
| Polymerization Initiator |  | Dicumyl Peroxide | part by mass | 9 | 9 | 9 | 9 | 9 | 9 | 9 | 9 | 9 |
| White Pigment | White Pigment 1 | Titanium Oxide | part by mass | 100 | 250 | 150 | 250 | 250 | 250 | — | — | 250 |
|  | White Pigment 2 | Aluminium Oxide | part by mass | — | — | — | — | — | — | 250 | — | — |
|  | White Pigment 2 | Barium Titanate | part by mass | — | — | — | — | — | — | — | 250 | — |
| Inorganic Filler | Inorganic Filler 1 | Silica | part by mass | 50 | 50 | 150 | 150 | 150 | 250 | 150 | 150 | — |
|  | Inorganic Filler 2 | Aluminium Hydroxide | part by mass | — | — | — | — | — | — | — | — | 150 |
| Release Agent |  | Zinc Stearate | part by mass | 4 | 6 | 6 | 6 | 6 | 6 | 6 | 6 | 6 |
| Reinforcing Material |  | Glass Fibers | part by mass | 30 | 45 | 40 | 55 | 55 | 65 | 55 | 55 | 55 |
| Injection Moldability |  |  |  | o(good) | o(good) | o(good) | o(good) | o(good) | o(good) | o(good) | o(good) | o(good) |
| Transfer Moldability |  |  |  | o(good) | o(good) | o(good) | o(good) | o(good) | o(good) | o(good) | o(good) | o(good) |
| Time-Dependent Change of Reflectivity (initial stage) |  |  | % | 90 | 93 | 89 | 93 | 93 | 89 | 85 | 87 | 89 |
| Time-Dependent Change of Reflectivity (after 1000 hours) |  |  | % | 74 | 76 | 75 | 77 | 77 | 78 | 71 | 72 | 71 |
| Heat Discoloration Resistance |  |  |  | o(good) | o(good) | o(good) | o(good) | o(good) | o(good) | o(good) | o(good) | o(good) |
| Blast-Deburring Capability |  |  |  | o(good) | o(good) | o(good) | o(good) | o(good) | o(good) | o(good) | o(good) | o(good) |
| Storage Stability |  |  |  | o(good) | o(good) | o(good) | o(good) | o(good) | o(good) | o(good) | o(good) | o(good) |
| Comprehensive Evaluation |  |  |  | excellent | excellent | excellent | excellent | excellent | excellent | average | average | good |

TABLE 2

|  |  |  | unit | Comparative Example 1 | Comparative Example 2 | Comparative Example 3 | Comparative Example 4 | Comparative Example 5 | Comparative Example 6 |
|---|---|---|---|---|---|---|---|---|---|
| Unsaturated Polyester Resin | Resin | Unsaturated Alkyd Resin | part by mass | 70 | 70 | 70 | — | — | 70 |
|  | Crosslinking Agent 1 | Diallyl Phthalate Prepolymer | part by mass | 30 | 30 | 25 | — | — | — |
|  | Crosslinking Agent 2 | Diallyl Phthalate Monomer | part by mass | — | — | 5 | — | — | — |
|  | Crosslinking Agent 3 | Styrene Monomer | part by mass | — | — | — | — | — | 30 |
| Polymerization Initiator |  | Dicumyl Peroxide | part by mass | 9 | 9 | 9 | — | — | 9 |
| Epoxy Resin | Resin | Triglycidyl Isocyanurate | part by mass | — | — | — | 40 | — | — |
|  | Curing Agent | Hexahydrophthalic Anhydride | part by mass | — | — | — | 60 | — | — |
| Nylon Resin |  | Nylon 46 | part by mass | — | — | — | — | 100 | — |
| White Pigment | White Pigment 1 | Titanium Oxide | part by mass | 100 | 50 | 250 | 250 | 250 | 250 |
| Inorganic Filler | Inorganic Filler 1 | Silica | part by mass | 0 | 150 | 300 | 150 | 150 | 150 |
| Release agent |  | Zinc Stearate | part by mass | 3 | 4 | 6 | 6 | 6 | 6 |
| Reinforcing Material |  | Glass Fibers | part by mass | 25 | 35 | 75 | 55 | 55 | 55 |
| Injection Moldability |  |  |  | x (not good) | o(good) | x (not good) | x (not good) | o(good) | x (not good) |
| Transfer Moldability |  |  |  | x (not good) | o(good) | x (not good) | o(good) | x (not good) | o(good) |
| Time-Dependent Change of Reflectivity (initial stage) |  |  | % | — | 85 | — | 93 | 93 | 90 |
| Time-Dependent Change of Reflectivity (after 1000 hours) |  |  | % | — | 65 | — | 76 | x (not good) | 72 |
| Heat Discoloration Resistance |  |  |  | — | x (not good) | — | o(good) | x (not good) | o(good) |

TABLE 2-continued

|  | unit | Comparative Example 1 | Comparative Example 2 | Comparative Example 3 | Comparative Example 4 | Comparative Example 5 | Comparative Example 6 |
|---|---|---|---|---|---|---|---|
| Blast-Deburring Capability | — | — | ○(good) | — | x (not good) | unnecessary | ○(good) |
| Storage Stability | — | — | ○(good) | — | x (not good) | ○(good) | x (not good) |
| Comprehensive Evaluation | — | not good | not good | not good | not good | not good | not good |

<Evaluation Method>

(1) Injection Moldability

The unsaturated polyester resin composition for LED reflectors prepared in the blend ratio as in Examples 1 to 9 in Table 1 and Comparative Examples 1 to 6 in Table 2 was injection-molded, using an injection molding machine (Matsuda Seisakusho's 150-ton thermosetting injection-molding machine) at a mold temperature of 160° C. and for a curing time of 60 seconds, thereby preparing test pieces for molding shrinkage measurement according to JISK6911, and visually evaluated for the moldability thereof.

Those with good moldability are given "O" (good), and those with poor moldability are given "X" (not good). The results are shown in Tables 1 and 2.

(2) Transfer Moldability

The unsaturated polyester resin composition for LED reflectors prepared in the blend ratio as in Examples 1 to 9 in Table 1 and Comparative Examples 1 to 6 in Table 2 was transfer-molded, using a transfer molding machine (50-ton plunger-type transfer-molding machine), thereby preparing test pieces for molding shrinkage measurement according to JISK6911, and visually evaluated for the moldability thereof.

Those with good moldability are given "O" (good), and those with poor moldability are given "X" (not good). The results are shown in Tables 1 and 2.

(3) Time-Dependent Change of Reflectivity

The unsaturated polyester resin composition for LED reflectors prepared in the blend ratio as in Examples 1 to 9 in Table 1 and Comparative Examples 2 and 5 in Table 2 was molded, using a molding machine (Matsuda Seisakusho's 150-ton thermosetting injection-molding machine), while the unsaturated polyester resin composition for LED reflectors prepared in the blend ratio as in Comparative Examples 4 and 6 was molded, using a molding machine (50-ton plunger-type transfer molding machine), thereby preparing test pieces for determination of lime-dependent change of reflectivity according to JISK6911.

An LED having a wavelength of 460 nm was fitted to the test piece, and the lime-dependent change of the reflectivity of the LED reflector of 150° C. was measured with a reflectometer (Nippon Denshoku Kogyo's spectral colorimeter).

Figure 2:
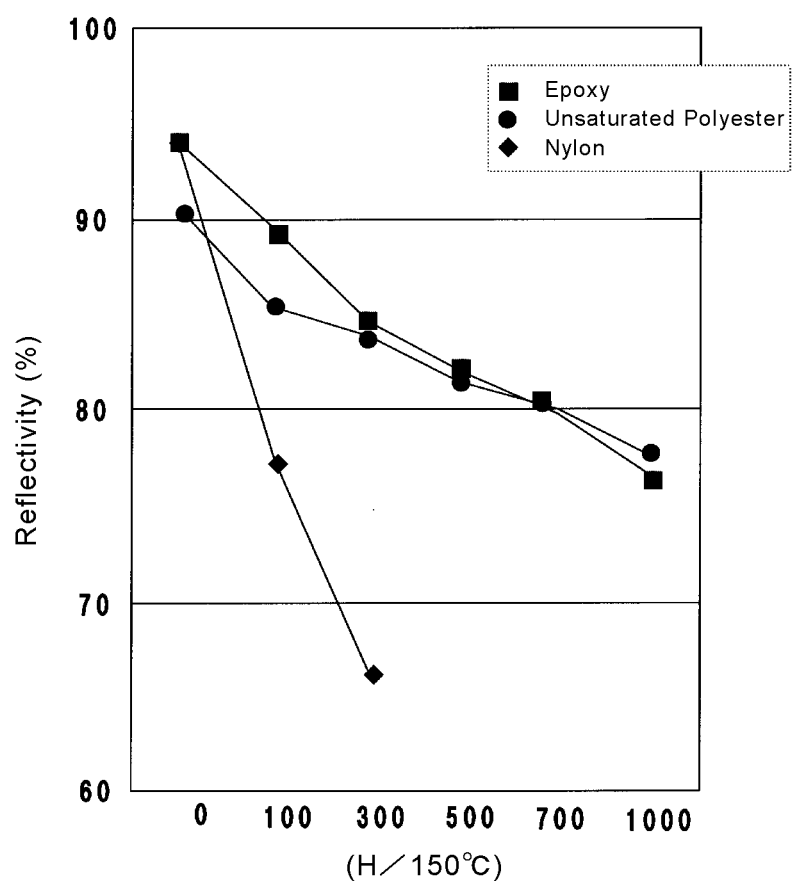
FIG. 2 This is a graph showing the time-dependent change of the reflectivity (wavelength: 460 nm) of LED reflectors.

A graph of the time-dependent change of reflectivity of the LED reflectors of Example 4 and Comparative Examples 4 and 5 is shown in FIG. 2.

In the graph of FIG. 2, (●) indicates the data of Example 4 (unsaturated polyester resin-made LED reflector), (■) indicates the data of Comparative Example 4 (epoxy resin-made LED reflector), (♦) indicates the data of Comparative Example 5 (nylon resin-made LED reflector).

The initial-stage reflectivity and the reflectivity after 1000 hours of Examples 1 to 9 and Comparative Examples 2 and 4 to 6 are shown in Tables 1 and 2.

(4) Heat Discoloration Resistance

In the test for time-dependent change of reflectivity, the reflectivity of the surface of each test piece after treated at 150° C. for 1000 hours was measured with a reflectometer (Nippon Denshoku Kogyo's spectral colorimeter).

The reflectivity was measured at a wavelength of 460 nm, and those having a reflectivity of 70% or more are given "O" (good), those having a reflectivity of less than 70% are given "X" (not good), and immeasurable ones are given "-". The results are shown in Tables 1 and 2.

(5) Blast-Deburring Capability

The unsaturated polyester resin composition for LED reflectors prepared in the blend ratio as in Examples 1 to 9 in Table 1 and Comparative Examples 2 and 5 in Table 2 was molded, using an injection-molding machine, while the unsaturated polyester resin composition for LED reflectors prepared in the blend ratio as in Comparative Examples 4 and 6 was molded, using a transfer-molding machine, thereby preparing test pieces for determination of blast-deburring capability according to JISK6911.

Each test piece was blasted (dry-blasting method; type of bead, nylon; condition, air flow of 1 m$^3$/min under 0.1 to 0.2 MPa), and visually evaluated for the blast-deburring capability thereof.

Those with good blast-deburring capability are given "O" (good), and those with poor blast-deburring capability are given "X" (not good). The results are shown in Tables 1 and 2.

(6) Storage Stability

The appearance of the resin composition for LED reflectors prepared in the blend ratio as in Examples 1 to 9 in Table 1 and Comparative Examples 2 and 4 to 6 was observed at 20° C., and the storage stability thereof was evaluated as to whether or not the resin composition changed from the initial state thereof.

Those with no change are given "O" (good), and those with some change are given "X" (not good).

<Evaluation Results>

Examples 1 to 9 satisfying the blend ratio range of the invention obtained good results in point of all the injection moldability, the transfer moldability, the blast-deburring capability and the storage stability. In particular, it has been confirmed that the resin composition of the invention containing silica as the inorganic filler is effective for injection molding and that silica has good influence on the heat discoloration resistance of the resin composition.

Comparative Example 1 in which the amount of the unsaturated polyester resin is more than 40% by mass of the total amount of the resin composition and in which the resin composition does not contain an inorganic filler, and Comparative Example 3 in which the amount of the unsaturated resin is less than 14% by mass and the amount of the white pigment and the inorganic filler is more than 74% by mass are not good in point of the injection moldability and the reflectivity indicating the heat discoloration resistance is immeasurable.

Comparative Example 2 in which the ratio of titanium oxide to the total of titanium oxide and silica is less than 30% by mass is good in point of the injection moldability, but the reflectivity thereof indicating the heat discoloration resistance is less than 70%.

Regarding the time-dependent change of reflectivity, the epoxy resin-made LED reflector of Comparative Example 4 and the nylon resin-made LED reflector of Comparative Example 5 both have a high initial-stage reflectivity than the unsaturated polyester-made LED reflector of the invention; however, with the lapse of time, the reflectivity of the former lowered and was, after 1000 hours, lower than the reflectivity of the unsaturated polyester resin-made LED reflector of Example 4.

From the above, it is confirmed that the time-dependent change of reflectivity of the unsaturated polyester resin-made LED reflector of Example 4 is smaller than that of the epoxy resin-made LED reflector of Comparative Example 4 and the nylon resin-made LED reflector of Comparative Example 5.

As obvious from Table 1, it is confirmed that the unsaturated polyester resin-made LED reflectors of the invention have an initial-stage reflectivity of at least 90% with LED at a wavelength of 460 nm, and have a reflectivity of 70% or more after left at 150° C. for 1000 hours.

Regarding the storage stability, the epoxy resin composition of Comparative Example 4 that cures at room temperature and the wet-type unsaturated polyester resin composition of Comparative Example 6 in which the crosslinking agent, styrene monomer evaporates at room temperature both thicken in the initial stage thereof, and the storage stability thereof is not good.

DESCRIPTION OF REFERENCE NUMERALS AND SIGNS

1 Lead Frame
2 LED Device
3 LED Reflector

The invention claimed is:

1. A dry-type unsaturated polyester resin composition containing at least an unsaturated polyester resin, a polymerization initiator, an inorganic filler, a white pigment, a release agent and a reinforcing material, wherein:
   an amount of the unsaturated polyester resin is within a range of from 14 to 40% by mass relative to an entire amount of the composition,
   a total amount of the inorganic filler and the white pigment is within a range of from 44 to 74% by mass relative to the entire amount of the composition,
   a proportion of the white pigment to the total amount of inorganic filler and the white pigment is at least 30% by mass,
   the unsaturated polyester resin is an unsaturated alkyd resin mixed with a crosslinking agent, and
   a mean particle size of the white pigment is at most 2.0 μm.

2. The dry-type unsaturated polyester resin composition according to claim 1, wherein the inorganic filler is at least one selected from the group consisting of silica, aluminium hydroxide, aluminium oxide, magnesium oxide, barium sulfate, magnesium carbonate and barium carbonate.

3. The dry-type unsaturated polyester resin composition according to claim 1, wherein the white pigment is at least one selected from the group consisting of titanium oxide, barium titanate, strontium titanate, aluminium oxide, magnesium oxide, zinc oxide, barium sulfate, magnesium carbonate and barium carbonate.

4. The dry-type unsaturated polyester resin composition according to claim 1, wherein an amount of the white pigment is within a range of from 100 to 300 parts by mass relative to 100 parts by mass of the unsaturated polyester resin.

5. The dry-type unsaturated polyester resin composition according to claim 1, wherein the total amount of the inorganic filler and the white pigment is at most 500 parts by mass relative to 100 parts by mass of the unsaturated polyester resin, and a mean particle size of the inorganic filler is at most 250 μm.

6. The dry-type unsaturated polyester resin composition according to claim 1, wherein the reinforcing material is glass fibers, and an amount of the reinforcing material is from 10 to 100 parts by mass relative to 100 parts by mass of the unsaturated polyester resin.

7. An LED reflector formed by molding a dry-type unsaturated polyester resin composition, the dry-type unsaturated polyester resin composition comprising at least an unsaturated polyester resin, a polymerization initiator, an inorganic filler, a white pigment, a release agent and a reinforcing material, wherein:
   an amount of the unsaturated polyester resin is within a range of from 14 to 40% by mass relative to an entire amount of the composition,
   a total amount of the inorganic filler and the white pigment is within a range of from 44 to 74% by mass relative to the entire amount of the composition,
   a proportion of the white pigment to the total amount of inorganic filler and the white pigment is at least 30% by mass, and
   the unsaturated polyester resin is an unsaturated alkyd resin mixed with a crosslinking agent.

8. The LED reflector according to claim 7, wherein the LED reflector is formed according to an injection-molding method.

9. The LED reflector according to claim 7, wherein the LED reflector is deburred by blasting treatment after the molding.

10. An LED luminaire fitted with the LED reflector of claim 7.

11. The LED reflector according to claim 7, wherein a mean particle size of the white pigment is at most 2.0 μm.

* * * * *